United States Patent
Ou et al.

(10) Patent No.: US 10,545,581 B2
(45) Date of Patent: Jan. 28, 2020

(54) SEMICONDUCTOR PACKAGE DEVICE

(71) Applicant: Advanced Semiconductor Engineering, Inc., Kaohsiung (TW)

(72) Inventors: Jen-Kai Ou, Kaohsiung (TW); Meng-Jen Wang, Kaohsiung (TW); Tsung-Yueh Tsai, Kaohsiung (TW); Chih-Ming Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 99 days.

(21) Appl. No.: 15/726,034

(22) Filed: Oct. 5, 2017

(65) Prior Publication Data

US 2019/0107897 A1    Apr. 11, 2019

(51) Int. Cl.
| | |
|---|---|
| *G06F 3/02* | (2006.01) |
| *G06F 3/041* | (2006.01) |
| *H01L 41/053* | (2006.01) |
| *H01L 41/23* | (2013.01) |
| *H01L 41/319* | (2013.01) |
| *H01L 41/293* | (2013.01) |
| *G06F 3/01* | (2006.01) |

(52) U.S. Cl.
CPC ............ *G06F 3/0202* (2013.01); *G06F 3/016* (2013.01); *G06F 3/0414* (2013.01); *H01L 41/053* (2013.01); *H01L 41/23* (2013.01); *H01L 41/293* (2013.01); *H01L 41/319* (2013.01)

(58) Field of Classification Search
CPC ...... G06F 3/0202; G06F 3/016; G06F 3/0414; H01L 41/053; H01L 41/23; H01L 41/293; H01L 41/319
See application file for complete search history.

(56) References Cited

U.S. PATENT DOCUMENTS

| | | | |
|---|---|---|---|
| 9,613,246 B1 | 4/2017 | Gozzini et al. | |
| 2008/0122315 A1* | 5/2008 | Maruyama | G06F 3/016 310/314 |
| 2014/0191973 A1 | 7/2014 | Zellers et al. | |
| 2016/0082735 A1* | 3/2016 | Furuya | B41J 2/14233 347/70 |
| 2018/0299958 A1* | 10/2018 | Wang | G06F 3/01 |

* cited by examiner

*Primary Examiner* — Charles V Hicks
(74) *Attorney, Agent, or Firm* — Foley & Lardner LLP

(57) ABSTRACT

An electronic device includes a piezoelectric module, a sensing module and a buffer element. The piezoelectric module includes a substrate and a piezoelectric element. The substrate defines an opening penetrating the substrate. The piezoelectric element is disposed on the substrate and across the opening of the substrate. The sensing module is disposed over the piezoelectric module. The buffer element is disposed between the piezoelectric module and the sensing module.

24 Claims, 19 Drawing Sheets

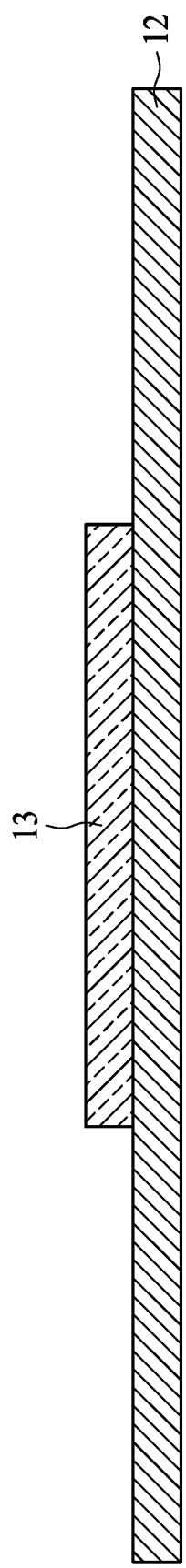

SEMICONDUCTOR PACKAGE DEVICE

BACKGROUND

1. Technical Field

The present disclosure relates to a semiconductor package device and to a semiconductor package device including a piezoelectric module.

2. Description of the Related Art

In an electronic device with a touch panel (such as a fingerprint recognition module), a switch bottom or a vibration motor can be used to provide a vibration feedback for a user who touches the touch panel. However, a relatively great thickness of the switch bottom or the vibration motor can hinder miniaturization of the electronic device.

SUMMARY

In some embodiments, an electronic device includes a piezoelectric module, a sensing module and a buffer element. The piezoelectric module includes a substrate and a piezoelectric element. The substrate defines an opening penetrating the substrate. The piezoelectric element is disposed on the substrate and across the opening of the substrate. The sensing module is disposed over the piezoelectric module. The buffer element is disposed between the piezoelectric module and the sensing module.

In some embodiments, an electronic device includes a piezoelectric module, a sensing module and a connection element. The piezoelectric module includes a substrate and a piezoelectric element. The piezoelectric element is disposed on the substrate. The sensing module is disposed over the piezoelectric module. The connection element is disposed between the piezoelectric module and the sensing module. The sensing module is configured to move in a direction toward the piezoelectric element to deform the piezoelectric element.

In some embodiments, an electronic device includes a piezoelectric module, a sensing module and a connection element. The piezoelectric module includes a substrate and a piezoelectric element. The piezoelectric element is disposed on the substrate. The sensing module is disposed over the piezoelectric module. The connection element is disposed between the piezoelectric module and the sensing module. The connection element electrically connects the sensing module with the substrate of the piezoelectric module.

BRIEF DESCRIPTION OF THE DRAWINGS

FIG. 5A, FIG. 5B and FIG. 5C illustrate a method for manufacturing a sensing module in accordance with some embodiments of the present disclosure.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
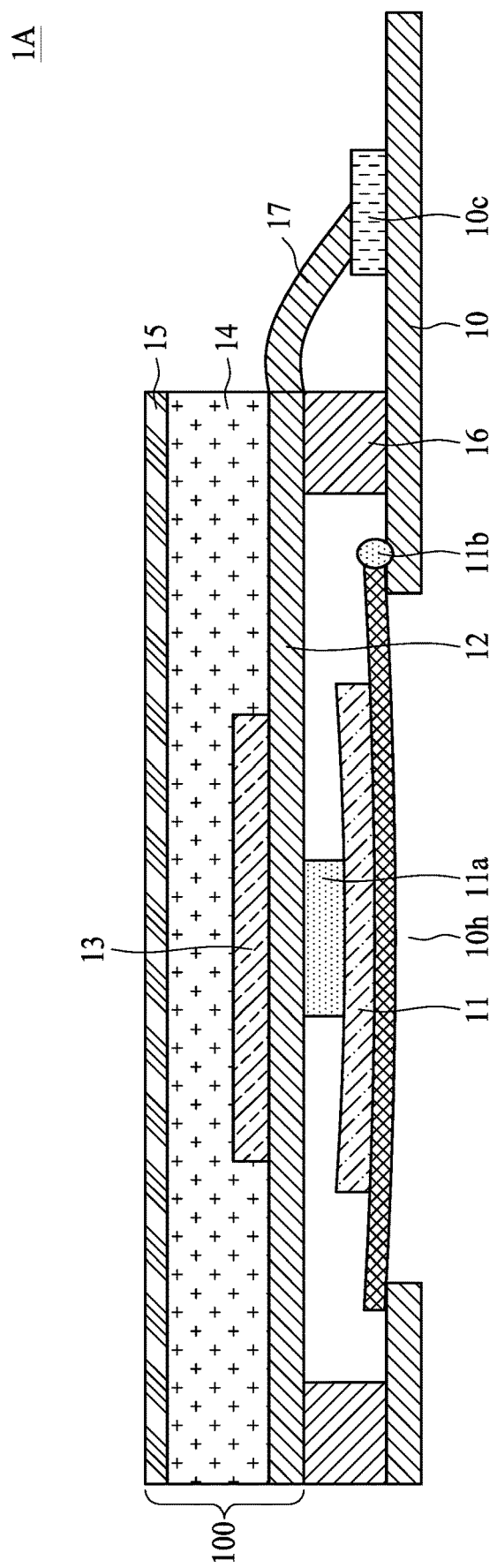
FIG. 1A illustrates a cross-sectional view of an electronic device in accordance with some embodiments of the present disclosure.

FIG. 1A illustrates a cross-sectional view of an electronic device 1A in accordance with some embodiments of the present disclosure. The electronic device 1A includes a substrate 10, a piezoelectric element 11, a buffer element 16 and a sensing module 100.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. The substrate 10 defines an opening 10h penetrating the substrate 10.

The piezoelectric element 11 is disposed on the substrate 10 and across the opening 10h of the substrate 10. The opening 10h can accommodate a deformation of the piezoelectric element 11. The piezoelectric element 11 includes an electrode 11a and an electrode 11b electrically connected to a carrier 12 and the substrate 10, respectively. In some embodiments, the piezoelectric element 11 includes a sensor configured to generate a voltage or potential difference across the electrode 11a and the electrode 11b when deformed or pressed. In some embodiments, the piezoelectric element 11 includes an actuator configured to physically change shape or vibrate when an external electric field is applied. For example, the piezoelectric element 11 can provide a haptic feedback and/or an audio feedback. In some embodiments, the piezoelectric element 11 includes lead zirconate titanate (PZT). In some embodiments, the substrate 10 and the piezoelectric element 11 can be also referred to as a piezoelectric module.

The sensing module 100 is disposed over the substrate 10 and the piezoelectric element 11. The sensing module 100 includes the carrier 12, an electronic component 13, a package body 14 and a lid 15. The sensing module 100 may be spaced apart from the piezoelectric element 11 to provide for a movement of the sensing module 100.

The carrier 12 is disposed over the substrate 10 and the piezoelectric element 11. The carrier 12 may be, for example, a soft or flexible substrate. The carrier 12 may include an interconnection structure, such as an RDL or a grounding element. The carrier 12 is electrically connected to a conductive contact 10c on the substrate 10 through a bonding wire 17.

The electronic component 13 is disposed on the carrier 12. In some embodiments, the electronic component 13 includes a sensing die including a light emitting device and/or a light detector. For example, the electronic component 13 may include a light-emitting diode (LED), a laser diode, or another device that may include one or more semiconductor layers. For example, the electronic component 13 may include a PIN diode (a diode including a p-type semiconductor region, an intrinsic semiconductor region, and an n-type semiconductor region) or a photo-diode or a phototransistor.

The package body 14 is disposed on the carrier 12 to cover the electronic component 13. In some embodiments, the package body 14 includes an epoxy resin. In some embodiments, the package body 14 includes a glass.

The lid 15 is disposed on the package body 14. The lid 15 is formed of, or includes, an optically transparent material (e.g. optically transparent to a wavelength of light emitted by the electronic component 13, or to a wavelength of light which the electronic component 13 is configured to detect). The lid 15 allows the transmission of light emitted by or received by the electronic component 13.

The buffer element 16 is disposed between the substrate 10 and the sensing module 100. In some embodiments, the buffer element 16 is made of or includes an elastic or flexible material that can provide a buffer between the sensing module 100 and the substrate 10 when the piezoelectric element 11 is deformed or pressed. For example, the buffer element 16 can include an elastomer or other suitable polymer. The substrate 10, the carrier 12 and the buffer element 16 define a space to accommodate the piezoelectric element 11. The sensing module 100 can be configured to move towards the piezoelectric element 11 and to bend or deform the piezoelectric element 11.

In some comparative electronic devices, a switch bottom or a vibration motor can be used to provide a vibration feedback. However, the relatively great thickness (e.g., 1-2 millimeters) of the switch bottom or the vibration motor hinders miniaturization of the electronic devices. In accordance with some embodiments of the electronic device 1A as shown in FIG. 1A, the piezoelectric module (including the piezoelectric element 11 and the substrate 10) is integrated with the sensing module 100 to provide the vibration feedback. Because a thickness of the piezoelectric module is about 0.4 millimeters or less, about 0.5 millimeters or less, about 0.6 millimeters or less, or about 0.7 millimeters or less, which is less than the thickness of the switch bottom and the vibration motor, a total size of the electronic device 1A can be reduced.

Figure 1B:
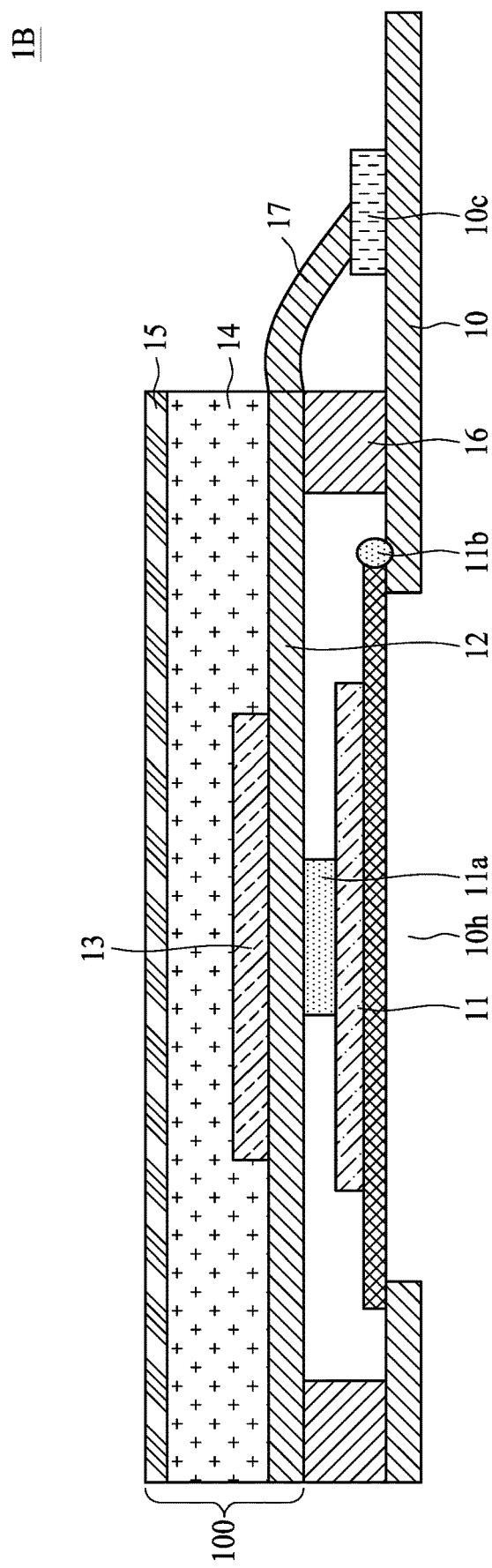
FIG. 1B illustrates a cross-sectional view of an electronic device in accordance with some embodiments of the present disclosure.

FIG. 1B illustrates a cross-sectional view of an electronic device 1B in accordance with some embodiments of the present disclosure. The electronic device 1B is similar to the electronic device 1A shown in FIG. 1A, except that as shown in FIG. 1A, the piezoelectric element 11 can be pre-pressed or bent (e.g. by the sensing module 100), while as shown in FIG. 1B, little to no force is applied on the piezoelectric element 11, and thus the piezoelectric element 11 is substantially parallel to the substrate 10.

Figure 2:
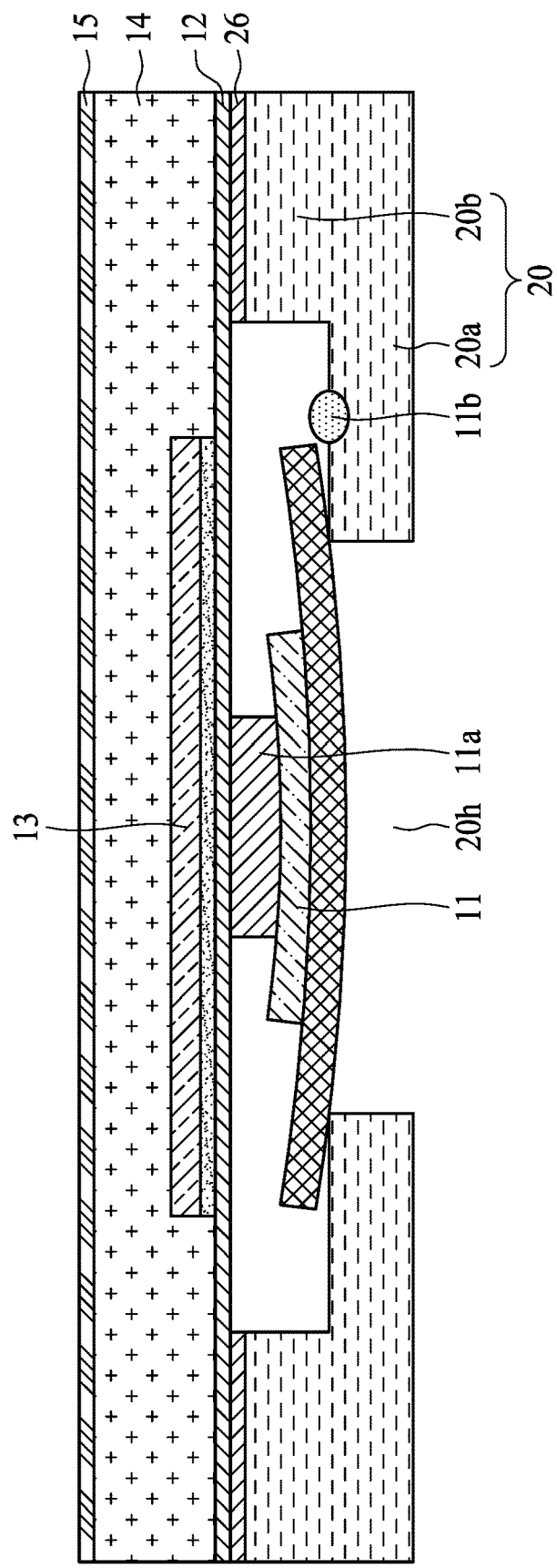
FIG. 2 illustrates a cross-sectional view of an electronic device in accordance with some embodiments of the present disclosure.

FIG. 2 illustrates a cross-sectional view of an electronic device 2 in accordance with some embodiments of the present disclosure. The electronic device 2 is similar to the electronic device 1A shown in FIG. 1A, except that as shown in FIG. 2, a substrate 20 is implemented, and the buffer element 16 shown in FIG. 1A is replaced by a dam structure 20b of the substrate 20 and an adhesive 26.

The substrate 20 includes a plane (or base) portion 20a and the dam structure 20b. The plane portion 20a defines an opening 20h. The dam structure 20b is disposed between the plane portion 20a of the substrate 20 and the sensing module 100. In some embodiments, the plane portion 20a and the dam structure 20b are integrally formed. The dam structure 20b and/or the plane portion 20a may be electrically conductive. In some embodiments, the substrate 20 may be a ceramic substrate. In some embodiments, the dam structure 20b includes an interconnection structure therein to provide for electrical connections between the sensing module 100 and the plane portion 20a of the substrate 20.

The adhesive 26 is disposed between the sensing module 100 and the dam structure 20b. The adhesive 26 is made of or includes an elastic or flexible material that can provide a buffer between the sensing module 100 and the dam structure 20b when the piezoelectric element 11 is deformed or pressed. The adhesive 26 can be a buffer element. The adhesive 26 can be a conductive buffer layer. The adhesive 26 can be a connection element. In some embodiments, the adhesive 26 may be or include a conductive adhesive, an anisotropic conductive film (ACF), a polymer core ball covered by a metal layer, or other suitable conductive materials. In some embodiments, a Young's modulus of the dam structure 20b of the substrate 20 is greater than a Young's modulus of the adhesive 26. The sensing module 100, the dam structure 20b, and a buffer element (e.g. the adhesive 26) can define a space that accommodates the piezoelectric element 11.

Figure 3:
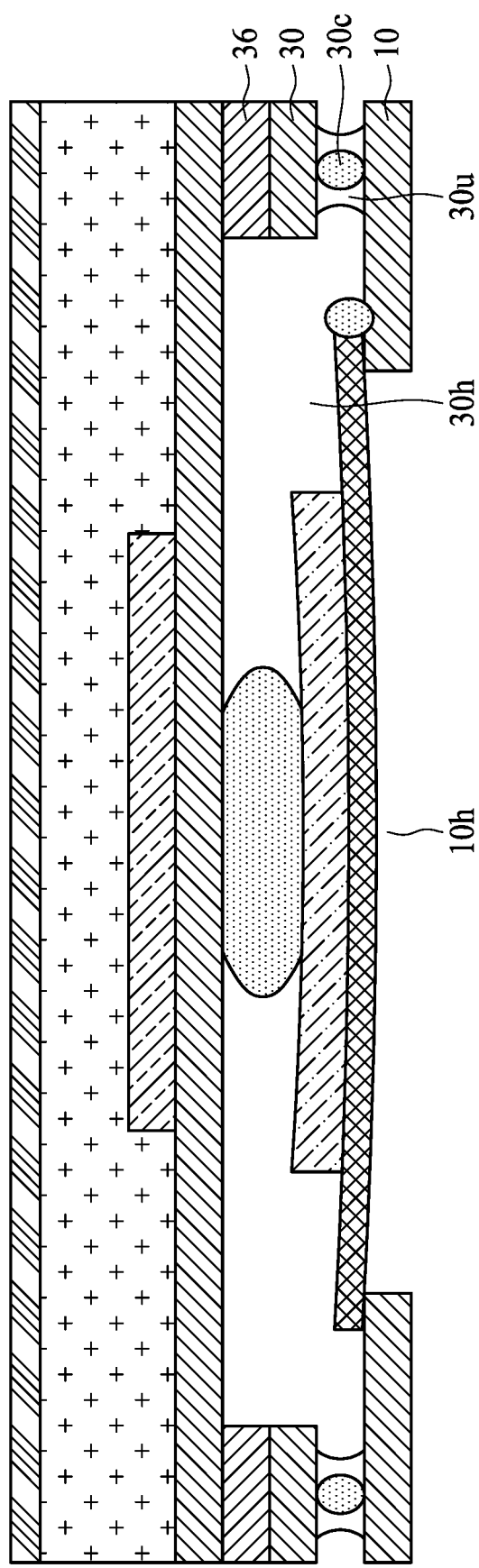
FIG. 3 illustrates a cross-sectional view of an electronic device in accordance with some embodiments of the present disclosure.

FIG. 3 illustrates a cross-sectional view of an electronic device 3 in accordance with some embodiments of the present disclosure. The electronic device 3 is similar to the electronic device 1A shown in FIG. 1A, except that as shown in FIG. 3, the buffer element 16 shown in FIG. 1A is replaced by a substrate 30 and an adhesive 36.

The substrate 30 is disposed between the substrate 10 and the sensing module 100. The substrate 30 may include, for example, a flexible printed circuit board, such as a paper-based copper foil laminate, a composite copper foil laminate, or a polymer-impregnated glass-fiber-based copper foil laminate. The substrate 30 may include an interconnection structure, such as an RDL or a grounding element. The substrate 30 is electrically connected to the substrate 10 through conductive contacts 30c. In some embodiments, the conductive contacts 30c can be encapsulated by an underfill 30u. The substrate 30 defines an opening 30h penetrating the substrate 30. In some embodiments, a width of the opening 30h of the substrate 30 is greater than a width of the opening 10h of the substrate 10.

The adhesive 36 is disposed between the sensing module 100 and the substrate 30. The adhesive 36 is made of or includes an elastic or flexible material that can provide a buffer between the sensing module 100 and the substrate 30 when the piezoelectric element 11 is deformed or pressed. In some embodiments, the adhesive 36 may be or include a conductive adhesive, an ACF, a polymer core ball covered by a metal layer or other suitable conductive materials. In some embodiments, a Young's modulus of the substrate 30 is greater than a Young's modulus of the adhesive 36.

Figure 4A:
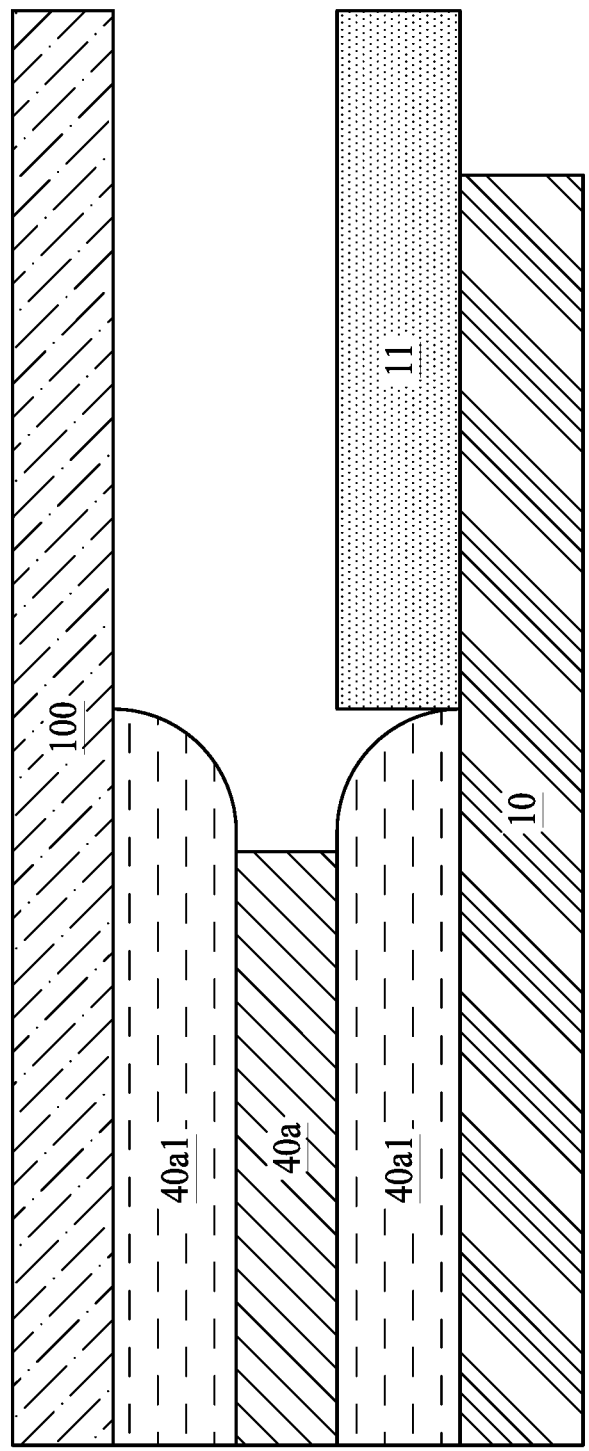
FIG. 4A, FIG. 4B and FIG. 4C illustrate different variations of an interconnection structure disposed between a sensing module and a substrate.
Figure 4B:
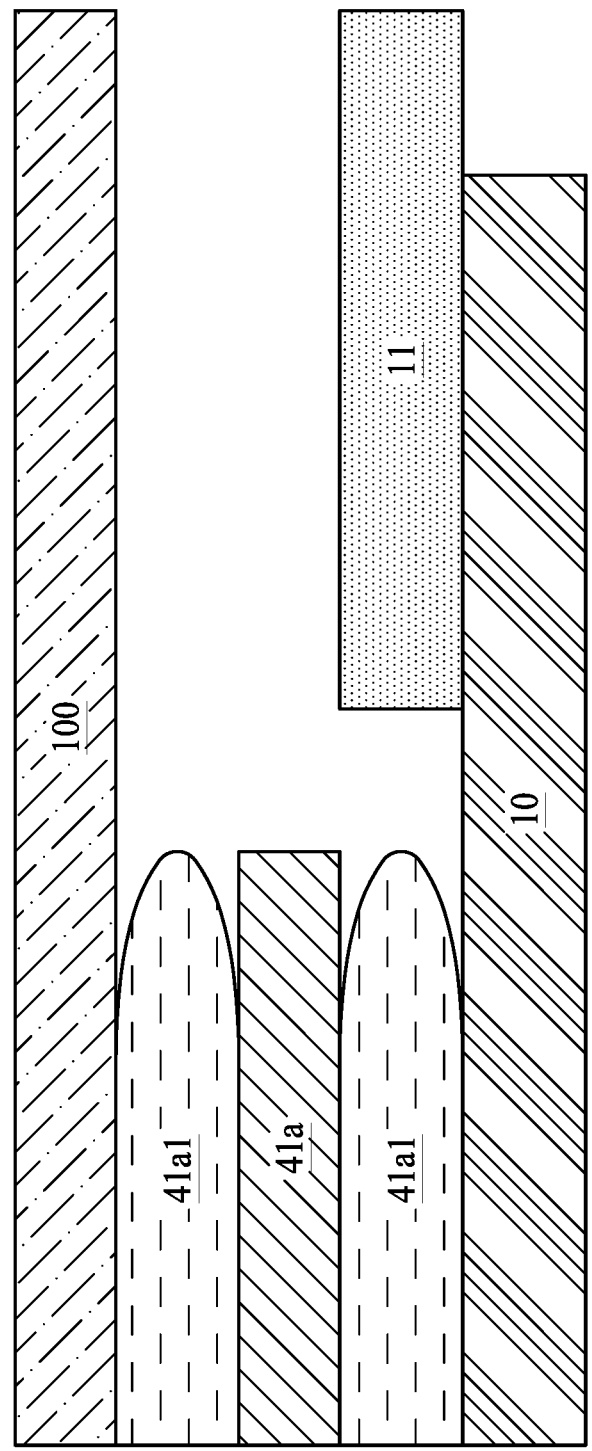
Figure 4C:
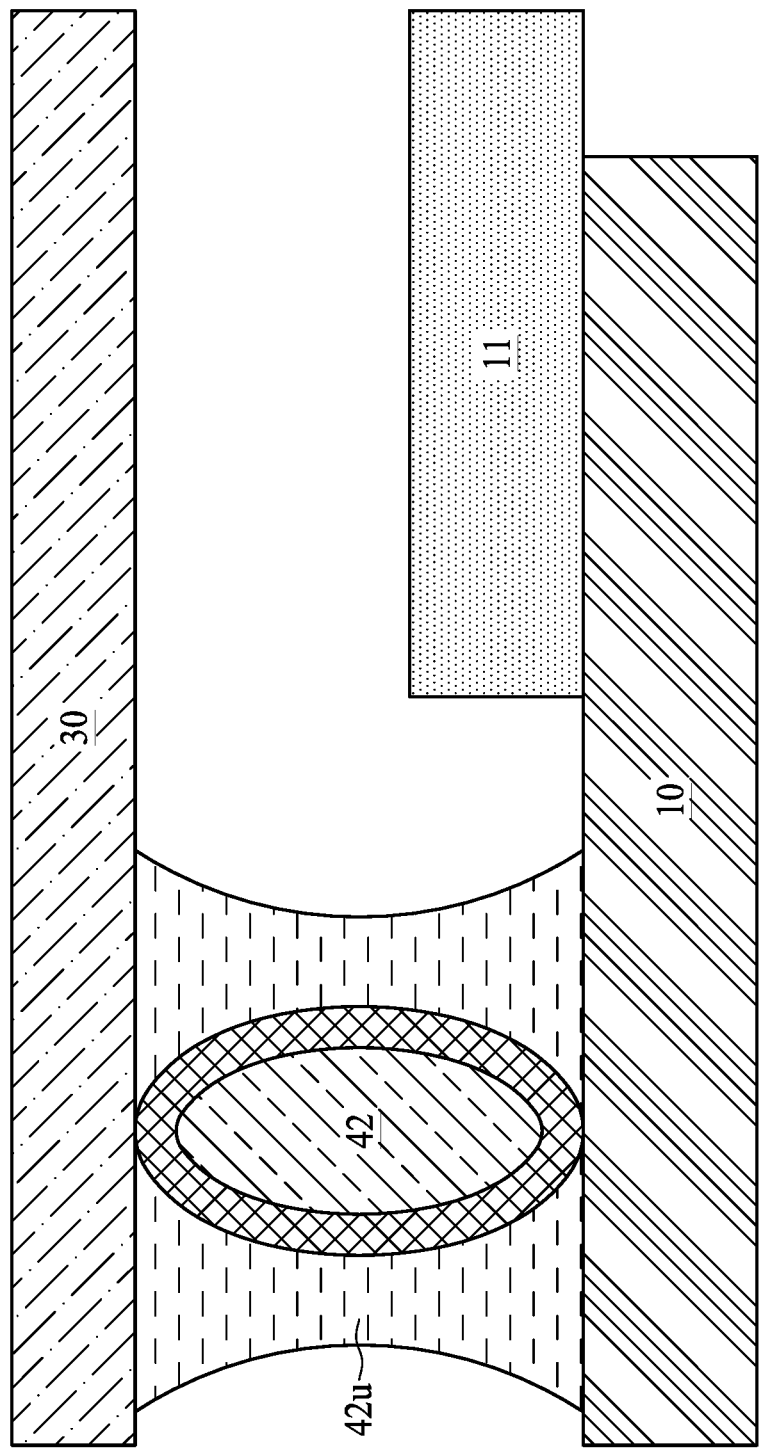

FIG. 4A and FIG. 4B illustrate comparative examples of an interconnection structure disposed between the sensing module 100 and the substrate 10, and FIG. 4C illustrates an interconnection structure disposed between the sensing module 100 and the substrate 10 in accordance with some embodiments of the present disclosure.

As shown in FIG. 4A, the sensing module 100 and the substrate 10 are connected through a circuit board 40a sandwiched by two conductive epoxy layers 40a1. However, during the process for manufacturing the interconnection structure shown in FIG. 4A, the conductive epoxy may bleed out and flow toward the piezoelectric element 11, which can cause an undesired electrical connection (e.g., a short circuit) between the interconnection structure and the piezoelectric element 11. In order to prevent the bleeding out of the conductive epoxy, an additional space between the interconnection structure and the piezoelectric element 11 may be implemented, which would increase a size and manufacturing cost of the interconnection structure.

As shown in FIG. 4B, the sensing module 100 and the substrate 10 are connected through a circuit board 41a sandwiched by two conductive films 41a1. In some embodiments, the conductive films 41a1 may be or include a pressure sensitive adhesive (PSA) or an ACF. However, manufacturing this structure may involve separating a piece of conductive film into multiple slices of conductive films, which can be challenging. In addition, assuring a desired alignment between the conductive film 41a1 and the circuit board 41a can also be challenging.

As shown in FIG. 4C, the sensing module 100 and the substrate 10 are connected through a conductive contact 42 and an underfill 42u. In some embodiments, the conductive contact 42 includes a polymer core covered by a metal layer. The conductive contact 42 is covered or encapsulated by the underfill 42u. In some embodiments, the underfill 42u includes an epoxy resin, a molding compound (e.g., an epoxy molding compound or other molding compound), a polyimide, a phenolic compound or material, a material including a silicone dispersed therein, or a combination thereof. The underfill 42u may prevent an undesired electrical connection (e.g., short circuit) between the conductive contact 42 and the piezoelectric element 11 without an additional space as shown in FIG. 4A, which can reduce a size and manufacturing cost of the depicted structure.

Figure 5B:
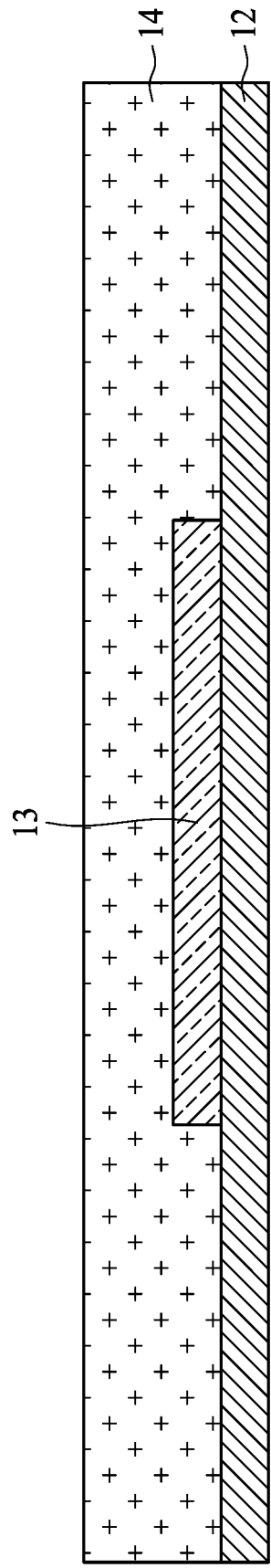
Figure 5C:
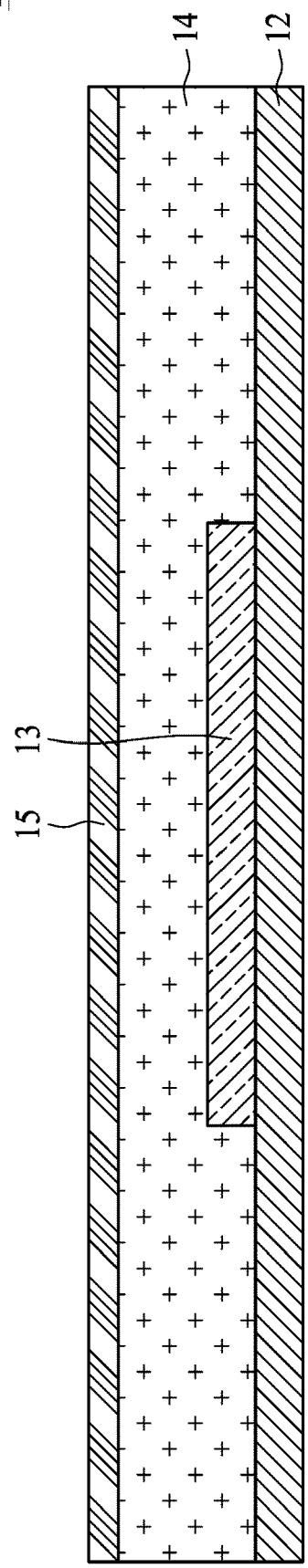

FIG. 5A, FIG. 5B and FIG. 5C illustrate a method for manufacturing the sensing module 100 as shown in FIG. 1A, FIG. 1B, FIG. 2 and FIG. 3 in accordance with some embodiments of the present disclosure. Although some processes, operations or stages are described in the following description with respect to each of a plurality of components, any of those processes, operations or stages may be selectively performed with respect to one of the plurality of components, or with respect to some number in between one and the full plurality of components.

Referring to FIG. 5A, a carrier 12 is provided. An electronic component 13 (e.g., a sensing die) is disposed on the carrier 12. In some embodiments, the electronic component 13 can be electrically connected to the carrier 12 through flip-chip or wire-bond techniques.

Referring to FIG. 5B, a package body 14 is formed on the carrier 12 to cover or encapsulate the electronic component 13. In some embodiments, the package body 14 may be formed by a molding technique, such as transfer molding or compression molding.

Referring to FIG. 5C, a lid (or cover) 15 is disposed on the package body to form a sensing module 100. The lid 15 is formed of, or includes, an optically transparent material. The lid 15 allows the transmission of light emitted or received by the electronic component 13.

Figure 6A:
FIG. 6A, FIG. 6B and FIG. 6C illustrate a method for manufacturing an electronic device in accordance with some embodiments of the present disclosure.
Figure 6A:
Figure 6B:
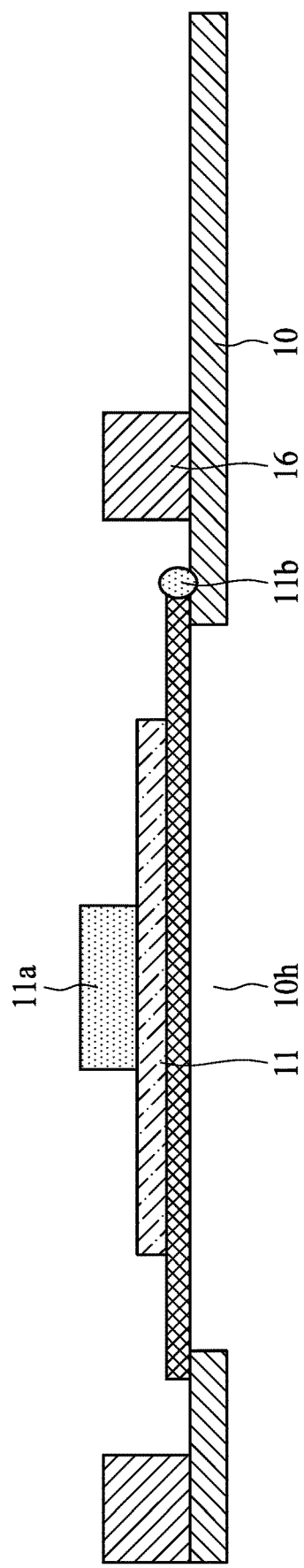
Figure 6C:
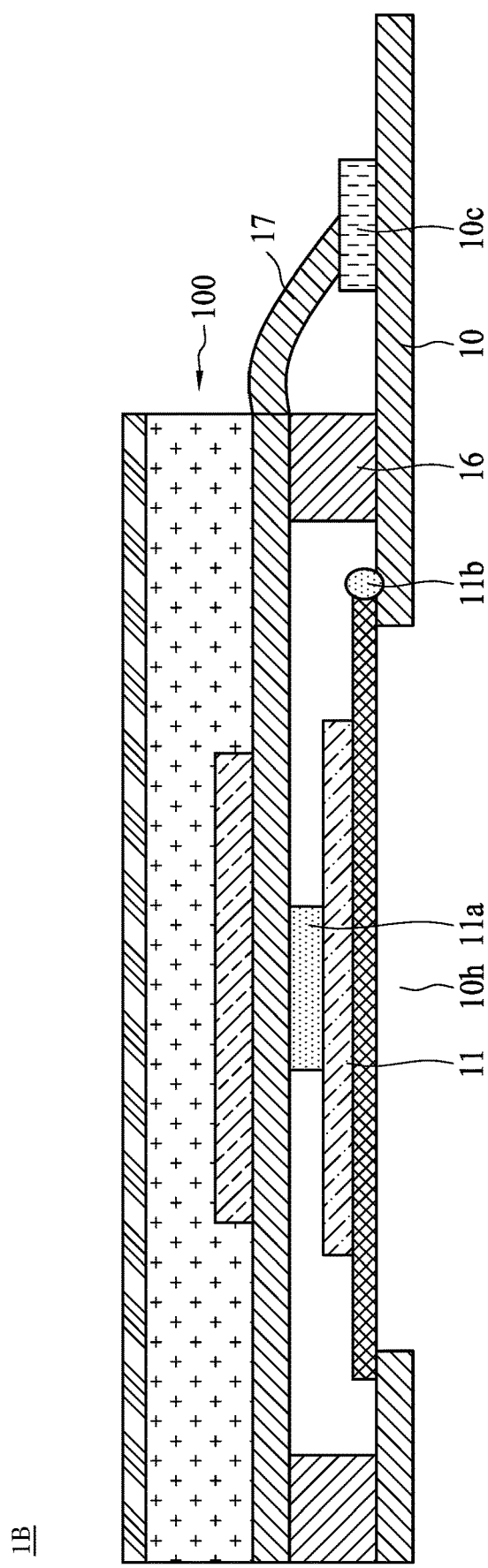

FIG. 6A, FIG. 6B and FIG. 6C illustrate a method for manufacturing the electronic device 1B as shown in FIG. 1B in accordance with some embodiments of the present disclosure. Although some processes, operations or stages are described in the following description with respect to each of a plurality of components, any of those processes, operations or stages may be selectively performed with respect to one of the plurality of components, or with respect to some number in between one and the full plurality of components.

Referring to FIG. 6A, a substrate 10 is provided and an opening 10h is formed to penetrate the substrate 10. In some embodiments, the opening 10h can be formed by mechanical drilling, laser drilling or other suitable processes.

Referring to FIG. 6B, a piezoelectric element 11 including an electrode 11a and an electrode 11b is disposed on the substrate 10 and across the opening 10h. A buffer layer 16 is disposed on the substrate 10 and adjacent to the piezoelectric element 11. A conductive material is then applied to the electrode 11a and the electrode 11b of the piezoelectric element 11 to provide for electrical connections. In some embodiments, the conductive material is or includes silver paste.

Referring to FIG. 6C, a sensing module 100 is disposed on the piezoelectric element 11 and the buffer element 16. The sensing module 100 is electrically connected to a conductive contact 10c on the substrate 10 through a bonding wire 17 to form the electronic device 1B as shown in FIG. 1B. As shown in FIG. 6C, the piezoelectric element 11 is not deformed or pressed by the sensing module 100. In other embodiments, the piezoelectric element 11 can be pre-pressed by the sensing module 100 as shown in FIG. 1A. In some embodiments, whether the piezoelectric element 11 is pre-pressed or not can be selected by implementing an appropriate thickness for the buffer element 16.

Figure 7A:
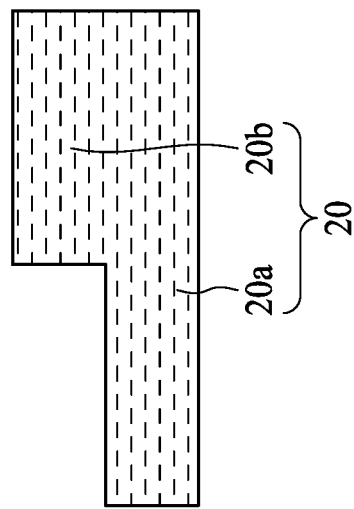
FIG. 7A, FIG. 7B and FIG. 7C illustrate a method for manufacturing an electronic device in accordance with some embodiments of the present disclosure.
Figure 7A:
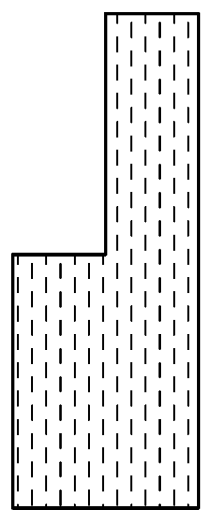
Figure 7B:
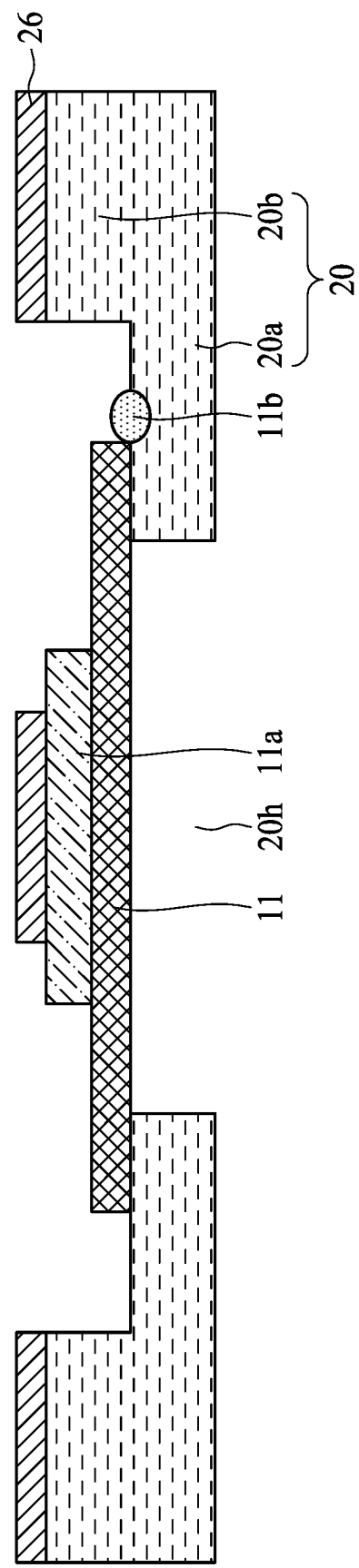
Figure 7C:
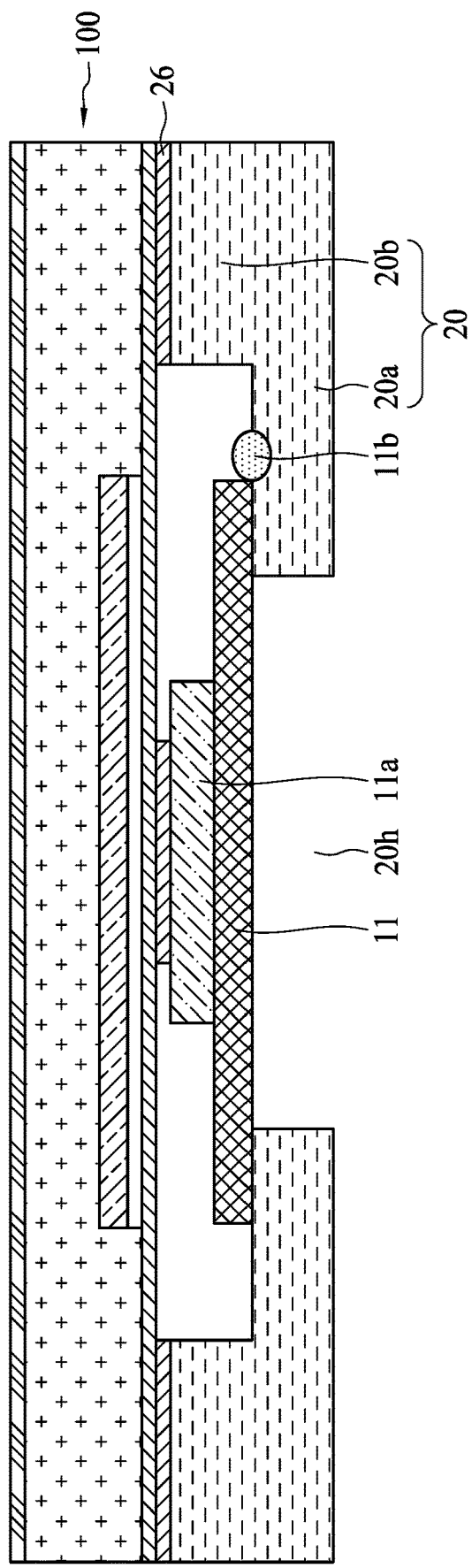

FIG. 7A, FIG. 7B and FIG. 7C illustrate a method for manufacturing an electronic device in accordance with some embodiments of the present disclosure. Although some processes, operations or stages are described in the following description with respect to each of a plurality of components, any of those processes, operations or stages may be selectively performed with respect to one of the plurality of components, or with respect to some number in between one and the full plurality of components.

Referring to FIG. 7A, a substrate 20 is provided. The substrate 20 includes a plane portion 20a and a dam structure 20b. An opening 20h is formed to penetrate the plane portion 20a of the substrate 20. In some embodiments, the opening 20h can be formed by mechanical drilling, laser drilling or other suitable processes.

Referring to FIG. 7B, a piezoelectric element 11 including an electrode 11a and an electrode 11b is disposed on the plane portion 20a of the substrate 20 and across the opening 20h. An adhesive 26 is applied on the dam structure 20b of the substrate 20. A conductive material is then applied to the electrode 11a and the electrode 11b of the piezoelectric element 11 to provide for electrical connections. In some embodiments, the conductive material is or includes silver paste.

Referring to FIG. 7C, a sensing module 100 is disposed on the piezoelectric element 11 and the dam structure 20b of the substrate 20. The sensing module 100 is electrically connected to the substrate 20 through the adhesive 26. As shown in FIG. 7C, the piezoelectric element 11 is not deformed or pressed by the sensing module 100. In other embodiments, the piezoelectric element 11 can be pre-pressed by the sensing module 100 to form the electronic device 2 as shown in FIG. 2.

Figure 8A:
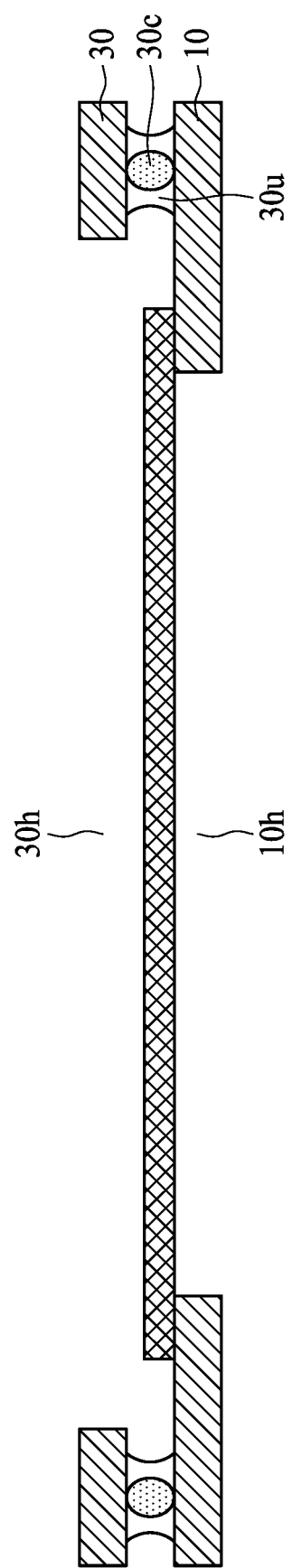
FIG. 8A, FIG. 8B and FIG. 8C illustrate a method for manufacturing an electronic device in accordance with some embodiments of the present disclosure.
Figure 8B:
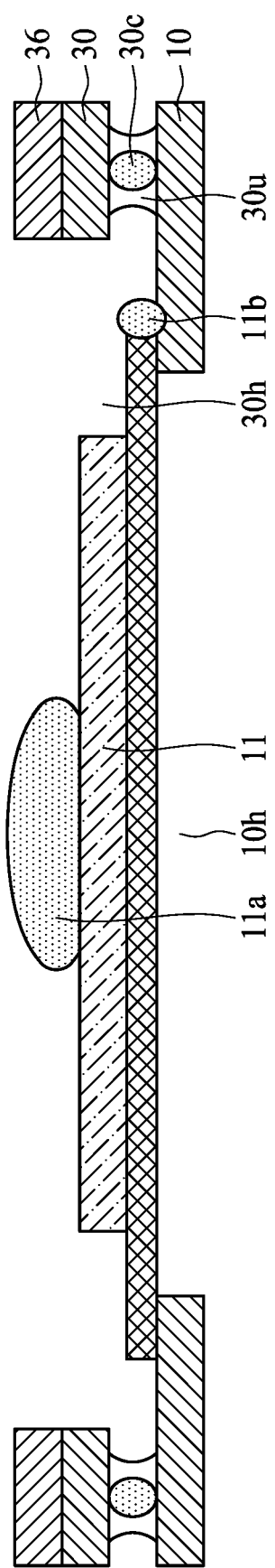
Figure 8C:
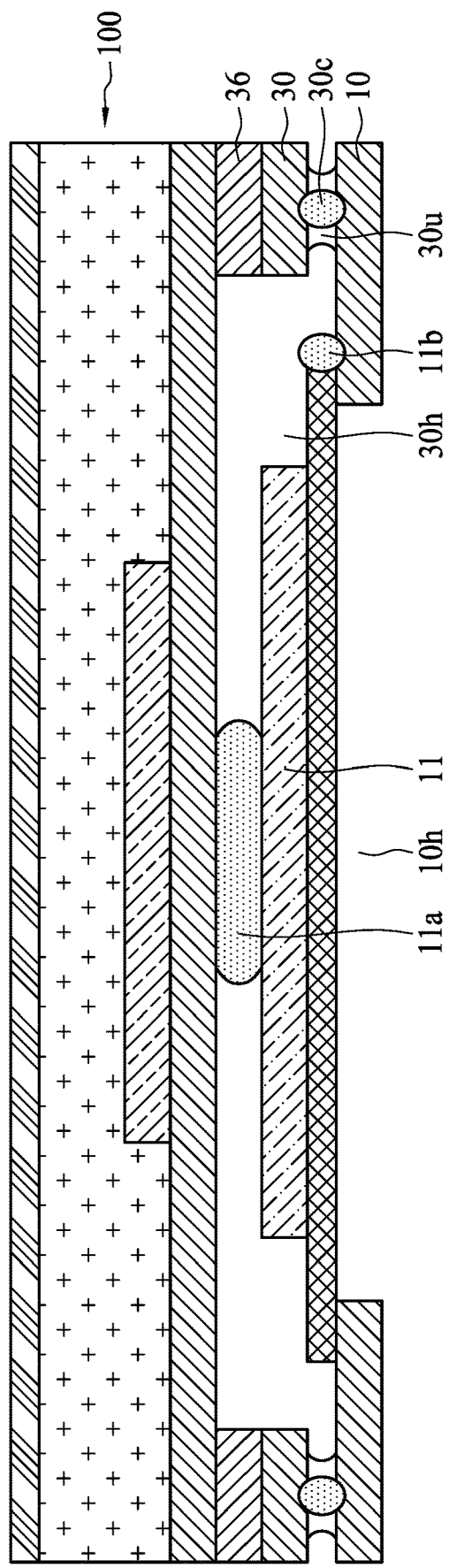

FIG. 8A, FIG. 8B and FIG. 8C illustrate a method for manufacturing an electronic device in accordance with some embodiments of the present disclosure. Although some processes, operations or stages are described in the following description with respect to each of a plurality of components, any of those processes, operations or stages may be selectively performed with respect to one of the plurality of components, or with respect to some number in between one and the full plurality of components.

Referring to FIG. 8A, a substrate 10 is provided and an opening 10h is formed to penetrate the substrate 10. In some embodiments, the opening 10h can be formed by mechanical drilling, laser drilling or other suitable processes. A substrate 30 is disposed on the substrate 10 and electrically connected to the substrate 10 through a conductive contact 30c. An opening 30h is formed to penetrate the substrate 30. In some embodiments, the opening 30h can be formed by mechanical drilling, laser drilling or other suitable processes. In some embodiments, a width of the opening 30h is greater than a width of the opening 10h. In some embodiments, an underfill 30u can be disposed to cover or encapsulate the conductive contact 30c.

Referring to FIG. 8B, a piezoelectric element 11 including an electrode 11a and an electrode 11b is disposed on the substrate 10 and across the opening 10h. An adhesive 36 is applied on the substrate 30. A conductive material is then applied to the electrode 11a and the electrode 11b of the piezoelectric element 11 to provide for electrical connections. In some embodiments, the conductive material is or includes silver paste.

Referring to FIG. 8C, the sensing module 100 is disposed on the piezoelectric element 11 and the substrate 30. The sensing module 100 is electrically connected to the substrate 10 through the adhesive 36 and the substrate 30. As shown in FIG. 8C, the piezoelectric element 11 is not deformed or pressed by the sensing module 100. In other embodiments, the piezoelectric element 11 can be pre-pressed by the sensing module 100 to form the electronic device 3 as shown in FIG. 3.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In some embodiments, two surfaces can be deemed to be coplanar or substantially coplanar if a displacement between the surfaces is small, such as no greater than 1 μm, no greater than 5 μm, or no greater than 10 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a piezoelectric module comprising:
      a substrate defining an opening penetrating the substrate; and
      a piezoelectric element disposed on the substrate and across the opening of the substrate;
   a sensing module disposed over the piezoelectric module; and
   a buffer element disposed between the piezoelectric module and the sensing module.

2. The electronic device of claim 1, wherein the buffer element comprises a conductive adhesive, a polymer core and a metal layer covering the polymer core, or an anisotropic conductive film (ACF).

3. The electronic device of claim 1, wherein the substrate comprises a plane portion and a dam structure, the dam structure disposed between the buffer element and the plane portion, wherein the sensing module, the dam structure and the buffer element define a space to accommodate the piezoelectric element.

4. The electronic device of claim 3, wherein a Young's modulus of the dam structure is greater than a Young's modulus of the buffer element.

5. The electronic device of claim 3, wherein the dam structure and the plane portion are integrally formed.

6. The electronic device of claim 3, wherein the dam structure comprises a printed circuit board.

7. The electronic device of claim 1, further comprising a conductive material disposed between the sensing module and the piezoelectric module to electrically connect the sensing module with the piezoelectric element.

8. The electronic device of claim 1, wherein the sensing module further comprises:
a carrier;
a die disposed on the carrier, the die comprising a light emitter or a light detector; and
a package body disposed on the carrier to cover the die.

9. The electronic device of claim 1, further comprising a flexible circuit board electrically connecting the sensing module to the substrate.

10. An electronic device, comprising:
a piezoelectric module comprising:
a substrate; and
a piezoelectric element disposed on the substrate;
a sensing module disposed over the piezoelectric module; and
a connection element disposed between the piezoelectric module and the sensing module,
wherein the sensing module is configured to move in a direction toward the piezoelectric element to deform the piezoelectric element.

11. The electronic device of claim 10, wherein the substrate defines an opening penetrating the substrate to define a space to accommodate a deformation of the piezoelectric element.

12. The electronic device of claim 10, wherein the connection element comprises an elastic material.

13. The electronic device of claim 10, wherein the connection element comprises a conductive adhesive, a polymer core and a metal layer covering the polymer core, or an ACF.

14. The electronic device of claim 10, wherein the sensing module is spaced apart from the piezoelectric element to provide for a movement of the sensing module.

15. The electronic device of claim 10, wherein the substrate comprises a plane portion and a dam structure disposed between the connection element and the plane portion, wherein the sensing module, the dam structure and the connection element define a space to accommodate the piezoelectric element.

16. The electronic device of claim 15, wherein the dam structure and the plane portion are integrally formed.

17. The electronic device of claim 15, wherein the dam structure comprises a printed circuit board.

18. The electronic device of claim 10, further comprising a flexible circuit board electrically connecting the sensing module with the substrate.

19. An electronic device, comprising:
a piezoelectric module comprising:
a substrate; and
a piezoelectric element disposed on the substrate;
a sensing module disposed over the piezoelectric module; and
a connection element disposed between the piezoelectric module and the sensing module, wherein the connection element electrically connects the sensing module with the substrate of the piezoelectric module.

20. The electronic device of claim 19, wherein the substrate defines an opening penetrating the substrate, and wherein the piezoelectric element is disposed across the opening of the substrate.

21. The electronic device of claim 19, wherein the substrate comprises a dam structure, and the connection element comprises a conductive buffer layer disposed over the conductive dam structure.

22. The electronic device of claim 21, wherein the dam structure comprises a printed circuit board.

23. The electronic device of claim 19, wherein the connection element comprises a conductive adhesive, a polymer core and a metal layer covering the polymer core, or an ACF tape.

24. The electronic device of claim 19, wherein the piezoelectric element is electrically connected to the sensing module and to the substrate of the piezoelectric module.

* * * * *